United States Patent
Bouche et al.

(10) Patent No.: US 7,960,200 B2
(45) Date of Patent: Jun. 14, 2011

(54) ORIENTATION-DEPENDENT ETCHING OF DEPOSITED ALN FOR STRUCTURAL USE AND SACRIFICIAL LAYERS IN MEMS

(75) Inventors: Guillaume Bouche, Beaverton, OR (US); Ralph N. Wall, Beaverton, OR (US)

(73) Assignee: Maxim Integrated Products, Inc., Sunnyvale, CA (US)

( * ) Notice: Subject to any disclaimer, the term of this patent is extended or adjusted under 35 U.S.C. 154(b) by 770 days.

(21) Appl. No.: 11/789,578

(22) Filed: Apr. 24, 2007

(65) Prior Publication Data

US 2008/0268575 A1    Oct. 30, 2008

(51) Int. Cl.
*H01L 21/00* (2006.01)
(52) U.S. Cl. .................. 438/52; 257/418; 257/E21.251
(58) Field of Classification Search .................. 438/52; 257/418, E21.251
See application file for complete search history.

(56) References Cited

U.S. PATENT DOCUMENTS

| | | | |
|---|---|---|---|
| 5,587,620 A | 12/1996 | Ruby et al. | |
| 5,630,949 A | 5/1997 | Lakin | |
| 6,306,313 B1 | 10/2001 | Fetter et al. | |
| 6,548,943 B2 | 4/2003 | Kaitila et al. | |
| 6,795,471 B2 | 9/2004 | Watanabe et al. | |
| 6,822,535 B2 | 11/2004 | Ma et al. | |
| 7,425,749 B2 * | 9/2008 | Hartzell et al. | 257/414 |
| 2005/0048757 A1 | 3/2005 | Aigner et al. | |
| 2005/0079686 A1 | 4/2005 | Aigner et al. | |
| 2005/0088257 A1 | 4/2005 | Ruby et al. | |
| 2005/0130360 A1 * | 6/2005 | Zhan et al. | 438/197 |
| 2007/0035364 A1 | 2/2007 | Sridhar et al. | |

OTHER PUBLICATIONS

Stanley Wolf et al., "Silicon Processing for the VLSI Era", 1986, pp. 420-421.
S. Saravanan et al., "A novel surface micromachining process to fabricate AlN unimorph suspensions and its application for RF resonators", Sensors and Actuators A, 130-131, 2006, pp. 340-345.
C. Youtsey et al., "Photoelectrochemical Etching of GaN", Materials Research Society Proceedings 468, 349, 1997, Abstract, 1 page.
Leo J. Schowalter et al., "Preparation and Characterization of Single-crystal Aluminum Nitride Substrates", MRS Internet J. Nitride Semicond. Res. 5S1, W6.7, 2000, 6 pages.

* cited by examiner

*Primary Examiner* — Steven J Fulk
(74) *Attorney, Agent, or Firm* — Blakely Sokoloff Taylor & Zafman LLP

(57) ABSTRACT

In accordance with the present invention, accurate and easily controlled sloped walls may be formed using AlN and preferably a heated TMAH for such purpose as the fabrication of MEMS devices, wafer level packaging and fabrication of fluidic devices. Various embodiments are disclosed.

39 Claims, 4 Drawing Sheets

ORIENTATION-DEPENDENT ETCHING OF DEPOSITED ALN FOR STRUCTURAL USE AND SACRIFICIAL LAYERS IN MEMS

BACKGROUND OF THE INVENTION

1. Field of the Invention

The present invention relates to the field of MEMS (micro-electro-mechanical systems) and wafer level packaging.

2. Prior Art

Prior art MEMS devices are typically fabricated using conventional processing techniques generally found in integrated circuit fabrication. They differ from integrated circuits, however, in that MEMS devices generally have moveable members requiring partially unsupported structures, such as cantilevered members, diaphragms and the like.

Silicon is generally used in MEMS technology and etched to create cavities. Either deep reactive ion etching or wet etch in KOH or TMAH solutions are used. Deep reactive ion etching leads to vertical edge of the cavity and wet etch leads to slopes in a similar way AlN can be etched. This is well documented in the literature. The major limitation here is that only monocrystalline Si can be used, hence a bulk substrate. There are no possibilities to have structures like inductors embedded below. The cavity in the silicon substrate has various disadvantages, including the fact that dimensions are not readily controllable and that being in the substrate itself, MEMS devices cannot be fabricated over an integrated circuit, thereby requiring a larger chip area for incorporating both MEMS devices and associated integrated circuitry.

Polymer materials can be deposited, but there are limitations to the use of such material in MEMS devices. SU8 resist is popular in MEMS technology, allowing for high aspect ratios and vertical walls as high as 80 microns. But polymers are generally low temperature materials only, show poor adhesion, cannot be etched properly with curves, may degas and are not hermetic.

Wafer level packaging has advantages in efficiency and avoids the handling of individual devices until the final dicing of the completed devices. However ease of wafer level packaging and reliability of the resulting packages are of paramount importance.

DETAILED DESCRIPTION OF THE PREFERRED EMBODIMENTS

Figure 1A:
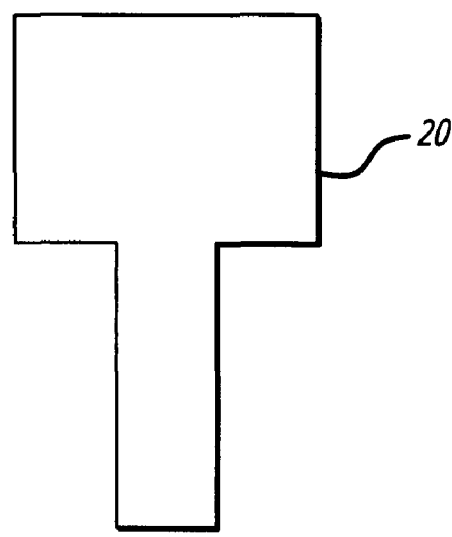
FIGS. 1a and 1b show a contact and pad and a cross section thereof formed as an initial step in forming a micro-relay.

In accordance with the present invention, AlN (aluminum nitride) may be advantageously used as a sacrificial layer in the construction of MEMS devices, as structural elements in MEMS devices and in wafer level packaging because of the ability to controllably etch the AlN in accordance with the present invention.

The deposited material is aluminum nitride with Al and N in stoechiometric proportion. It is classically deposited with a PVD (Physical Vapor Deposition) process by bombarding an aluminum target in a nitrogen-rich environment. The resulting AlN being dielectric, DC-pulsed or RF techniques are used in addition so as to prevent re-deposition on the target of an insulating film and interruption of the deposition. Typical application of the film itself in device is for bulk acoustic resonators and filters. The AlN then also has piezoelectric properties. The AlN layer is a polycrystalline material with very oriented grains along their C-axis. Its crystallography is hexagonal.

The etch of AlN is then comparable to one of the monocrystalline Si with KOH where an orientation-dependent etching takes place, exposing a slow etching plane (which is the plane where atoms are the most densely packed).

The ability to create a slope by etching is dependent on the quality of the orientations of grain, with a densely packed plane of atoms continuous or semicontinuous from one grain to an adjacent grain. FWHM misorientation of main axis to the vertical direction is in the order of 1 to 2° preferably (measured with XRD and theta-2theta scan).

Etching in the present invention is accomplished primarily by employing heated tetra-methyl-ammonium-hydroxide (TMAH) in a wet immersion etch. The masking can be accomplished by a patterned TiW layer and negative acting photo-resist, though other mask materials may be used such as $SiO_2$ and $Si_3N_4$.

It is discovered that highly oriented AlN will etch in heated TMAH with a controlled slope and a controlled CD because lateral etch rates are very low. Temperatures in the range of 25 C to 80 C are preferred, though other temperatures may be used if desired. Etching of an AlN layer will be selective along a slope corresponding to a dense plane of its crystallographic orientation. Positive tone photo-resists dissolve in hot TMAH. Negative tone resists perform better, but adhesion is still usually not adequate, particularly for thicker films requiring longer bath exposure times. To improve resist adhesion, TiW is patterned beneath the photo-resist. The negative tone photo-resist is still required in many applications because the TiW by itself typically does not provide adequate step coverage protection over a topography. The TMAH etch is a batch process in a low cost sink. Therefore throughput is high and the process cost is low. TMAH does not etch TiW or tungsten or molybdenum or platinum or many other potential bottom electrode materials.

Alternatively, AlN can be etched in chlorine or bromine plasmas, but the etch rates are slow and the ability to stop the etch on thin bottom electrodes is difficult. The etch profile is typically near vertical. The plasma etch equipment is very expensive and wafers are etched one at a time.

Wet AlN etching in other wet chemistries such as HF mixtures has been reported, but etch selectivity to many electrode metals is poor, resist adhesion to AlN in HF baths is inadequate, and the etch rate is much more isotropic than with TMAH.

Figure 1B:
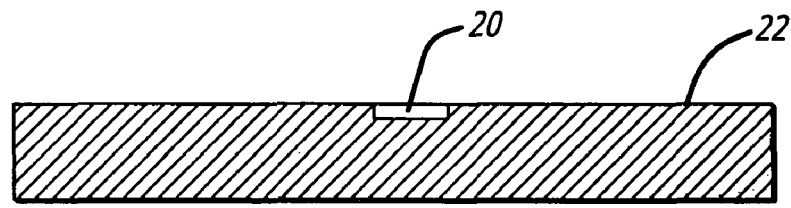
Figure 2:
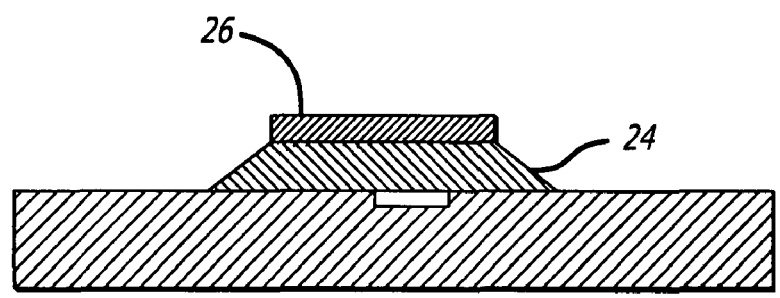
FIG. 2 illustrates the contact and pad of FIG. 1a and 1b after a layer of AlN is deposited and etched back.
Figure 3A:
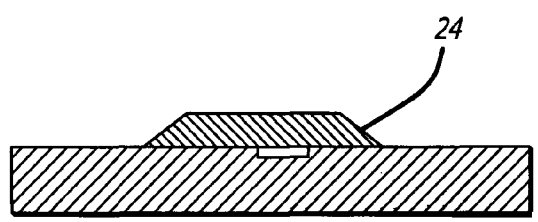
FIGS. 3a and 3b illustrate the contact and pad after the photo-resist and TiW is removed.
Figure 3B:
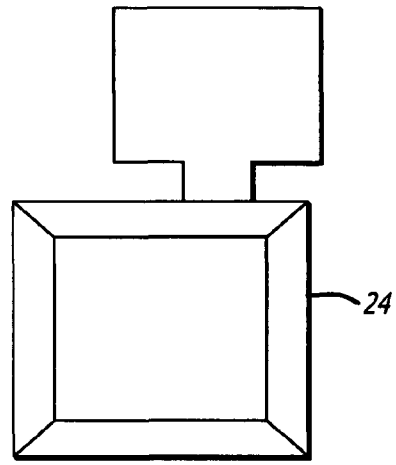
Figure 4A:
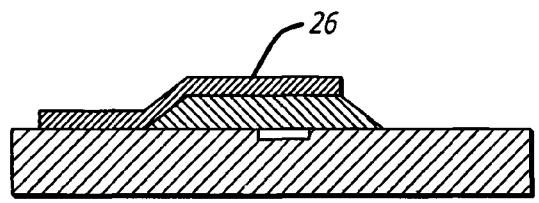
FIGS. 4a and 4b illustrate the contact and pad after an upper contact and pad is deposited and patterned.
Figure 4B:
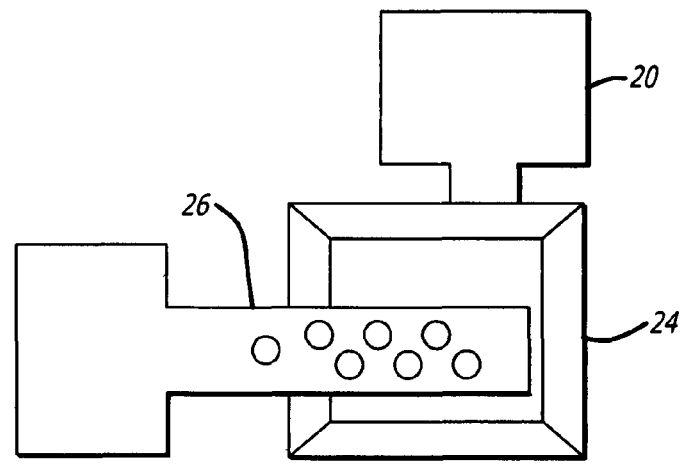

An example of an application of the present invention is its use in the fabrication of MEMS devices, the example specifically disclosed herein being a microswitch. In such an application, a contact and pad is put down on the substrate, typically in the form of a deposited and patterned layer of metal. Such a contact and pad 20 is schematically shown in FIG. 1a, with a cross-section of the substrate 22 being shown in FIG. 1b. Thereafter a layer of AlN is deposited and etched back as shown in FIG. 2, to create an AlN island 24 as shown in FIG. 2. The mask 26 used may be, as previously mentioned, as negative tone photo-resist, preferably with an adhesion layer thereunder such as TiW. As previously mentioned, preferably heated TMAH is used to etch the AlN, which etchant does not etch TiW. Accordingly, typically first the negative tone photo-resist would be patterned and then the TiW layer patterned using the photo-resist as a mask. Once the photo-resist and TiW is removed the AlN island 24 appears as shown in FIG. 3a, also shown in planform in FIG. 3b. Thereafter an upper contact and pad 26 is deposited and patterned as shown in FIGS. 4a and 4b, with a cantilevered member disposed over member 20 and separated therefrom by the AlN island 24. The upper electrode member may have holes formed therein when the same is patterned, which holes may improve the speed of operation of the microswitch and also aid in the etching away of the sacrificial AlN layer 24. The cantilevered upper contact member 26 is finally set free by the etching away of the AlN island 24, preferably using heated TMAH as the etchant, the process resulting in the cantilevered member 26 shown in FIG. 5.

Figure 5:
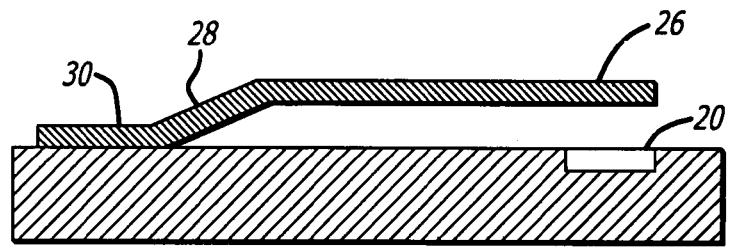
FIG. 5 is illustrates cantilevered upper contact member 26 after being set free by the etching away of the AlN island.

In the foregoing description a number of details of the structure of a typical microswitch and its operation have not been described, though details of certain microswitches may be found in U.S. Pat. No. 6,621,135. While the structure of the cantilevered member 26 shown in FIG. 5 is similar to that used in the prior art, it differs therefrom in an important aspect, specifically, the slope 28 connecting the cantilevered portion 26 and the contact pad portion 34. That incline, readily controlled in accordance with the present invention, eliminates sharp corners, yet results in a well-defined and repeatable slope not readily achieved by other techniques. The elimination of sharp corners is important, as depositing the top electrode onto a sacrificial spacing member having sharp-corners will result in a very thin deposition on a sharp corner, and on the sidewall of such a sacrificial spacing member depending on the deposition process used. This results in the weakest part of the cantilever electrode being in the region of the highest bending moment when flexed into contact with contact 20, a most unfavorable condition. The slope obtained with AlN using the present invention eliminates such sharp corners and allows for a much more uniform deposition from the contact pad 34 to the cantilevered member 26, thereby resulting in a much more durable microswitch.

Figure 6:
FIG. 6 illustrates a completed wafer ready for packaging.
Figure 7:
FIG. 7 illustrates the wafer of FIG. 6 after planarization of the surface thereof.
Figure 8:
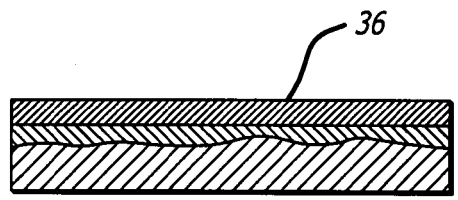
FIG. 8 illustrates the wafer after a layer of AlN is deposited.
Figure 9:
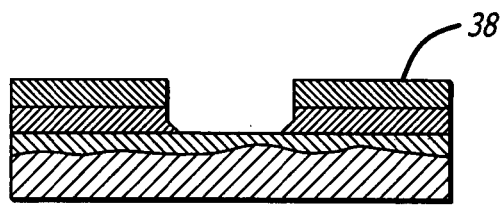
FIG. 9 illustrates the wafer after masking and etching to create a raised matrix surrounding each of the devices or circuits on the wafer.
Figure 10:
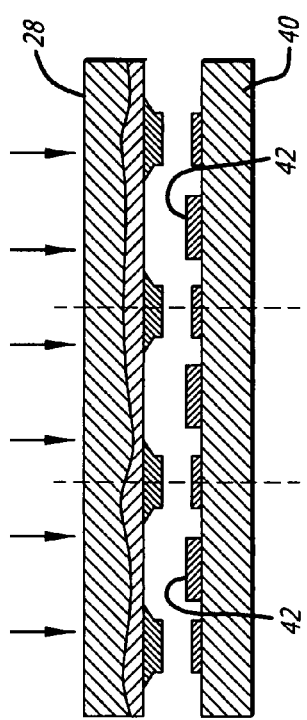
FIG. 10 illustrates the bonding of the wafer to a bottom layer.

Another application of the present invention is in wafer level packaging as schematically illustrated in FIG. 6 through 10. In this exemplary embodiment, a capping substrate 28 which may have devices formed thereon, such as integrated circuits, is bonded to a base substrate 40 also having devices thereon, such as devices 42, which by way of example, may be one or more BAW (bulk acoustic wave) devices. In this example, typically a completed wafer 32 has a somewhat irregular surface topography, as shown in FIG. 6. In accordance with an exemplary embodiment of this aspect of the present invention, a thick oxide 34 is deposited planarized by chemical mechanical polishing (CMP) as shown in FIG. 7. Thereafter a layer 36 of AlN is deposited as shown in FIG. 8, followed by a suitable mask, preferably a TiW layer which is patterned and then used as a mask 38 for the subsequent etching of the AlN layer, preferably by heated TMAH, as shown in FIG. 9. The masking and etching creates a raised matrix surrounding each of the devices or circuits on the capping substrate and creates the tapered edges hereinbefore described, providing a larger footprint for adhesion and lowering the stress concentration. Thereafter the capping substrate so prepared is bonded to the base substrate 40 having suitable pads thereon for bonding to the top of the raised AlN regions on the capping substrate 28 as illustrated in FIG. 10. The bonding both creates a seal surrounding the BAW devices, with the raised AlN matrix relative to the top of the BAW devices forming a cavity over the BAW devices so as to not significantly effect their acoustic capabilities.

Alternatively, the AlN matrix may be coated with another film for bonding to the base substrate 40, such as Au, $SiO_2$ or Cu. Thereafter the packaged devices may be diced to separate the devices, perhaps with solder balls created for solder ball bonding of the devices to a printed circuit board. Vias for bring out contacts to the devices may be formed various ways, and in either one of both substrates, for example, by methods such are disclosed in U.S. patent application Ser. No. 11/265,810 filed Nov. 3, 2005 and assigned to the assignee of the present invention, the disclosure of which is incorporated herein by reference.

In the foregoing description, it was noted that the raised AlN matrix surrounds each of the devices or circuits on the capping substrate, and when bonded to the base substrate, both creates a seal surrounding the BAW devices and forms a cavity over the BAW devices. The word "surround" as used herein and in the claims is used in the general sense to not exclude the possibility that of the AlN layer extending over part of the devices on the capping wafer, such as over part of the integrated circuits thereon.

Figure 11:
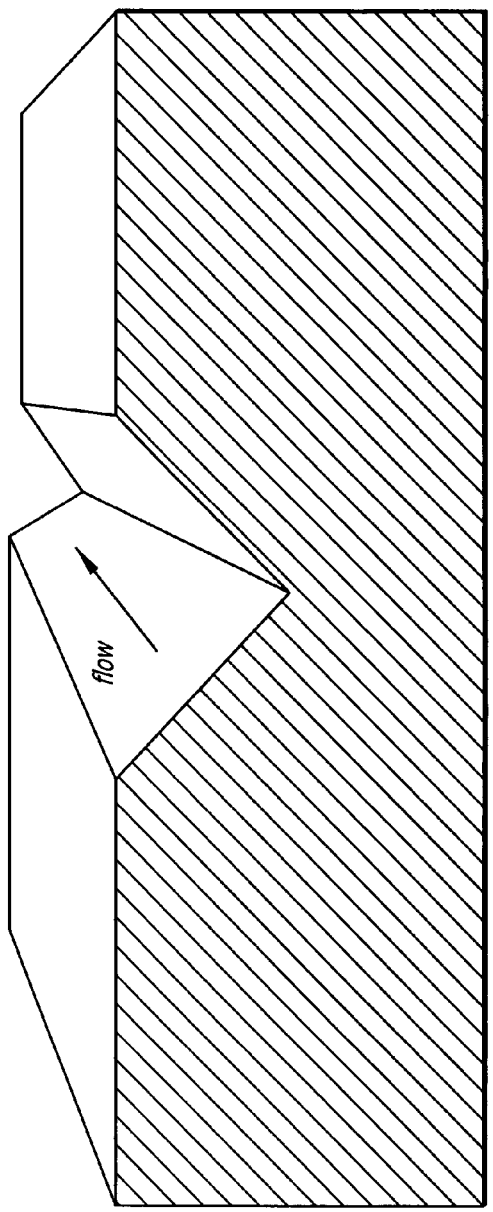
FIG. 11 illustrates the etching of the required flow channels for fluidic devices.

Another application of the present invention is in the fabrication of micro-fluidic devices. Such devices use fluid or compressible medium to perform analog or digital operations similar to those performed with electronics. However they generally require very fine and accurate channels for proper functioning. The present invention allows the accurate etching of the required channels in an AlN layer, as schematically shown in FIG. 11. Again, masking prior to etching preferably would be by depositing an adhesion layer such as TiW, adding and patterning a negative tone photo resist, patterning the TiW layer and finally etching the AlN layer to form the channel. Because of the highly directional etching, the channel slopes and depth are readily controlled and insensitive to the time of etching. Typically the fluidic device would have a capping layer over the channels for to enclose the same.

While certain preferred embodiments of the present invention have been disclosed and described herein for purposes of illustration and not for purposes of limitation, it will be understood by those skilled in the art that various changes in form and detail may be made therein without departing from the spirit and scope of the invention.

What is claimed is:
1. A method of fabricating a MEMS device comprising:
providing a first substrate;
depositing a layer of AlN;
patterning the layer of AlN while creating a slope at the edges of the patterned layer;
depositing a top electrode;
patterning the top electrode to define a cantilevered member pattern extending up a slope at the edges of the patterned layer of AlN and extending over a part of the patterned layer of AlN; and, etching to remove the patterned layer of AlN and to leave a cantilevered member supported on an integral sloped support member.

2. The method of claim 1 further comprising forming an electrode under the patterned layer of AlN prior to depositing the layer of AlN.

3. The method of claim 1 wherein the layer of AlN is patterned using a wet etch.

4. The method of claim 3 wherein the wet etch is TMAH.

5. The method of claim 3 wherein the wet etch is heated TMAH.

6. The method of claim 5 wherein the layer of AlN is etched through a mask comprising a patterned layer of negative tone photo resist.

7. The method of claim 6 wherein an adhesion layer is deposited onto the AlN layer before the photo resist is applied.

8. The method of claim 5 wherein the layer of AlN is etched through a mask comprising a patterned layer of negative tone photo resist over a layer selected from the group consisting of TiW, W, $SiO_2$ and $Si_3N_4$ on the AlN.

9. The method of claim 5 wherein the etching to remove the patterned layer of AlN comprises etching with TMAH.

10. The method of claim 1 wherein the top electrode is metallic.

11. The method of claim 1 wherein a plurality of the MEMS devices are formed in a matrix on the first substrate, and further comprising:

providing a capping substrate;

depositing a layer of AlN over the capping wafer;

etching the AlN layer through a mask to leave an AlN matrix with sloped bases;

bonding the surface AlN matrix to the first substrate so that each cell of the AlN matrix surrounds a respective device on the first substrate to package the devices; and, dicing the substrates to separate packages of MEMS devices.

12. The method of claim 11 wherein the matrix of devices on the first substrate has a matrix of BAW devices thereon and the capping wafer also has a matrix of devices thereon, and further comprising:

providing a thick oxide over a surface of the capping substrate, including the devices on the capping substrate;

planarizing the surface of the thick oxide; and wherein depositing a layer of AlN over the capping wafer comprises depositing the layer of AlN over the planarized surface of the thick oxide so that each cell of the AlN matrix also surrounds a respective device on the capping wafer, the bonding of the surface AlN matrix to the first substrate also forming cavities over each BAW on the first substrate.

13. The method of claim 12 wherein at least some of the devices are integrated circuits.

14. The method of claim 11 wherein the AlN layer is etched using heated TMAH.

15. The method of claim 14 wherein the AlN is etched through a mask comprising a negative tone photo resist.

16. The method of claim 15 wherein an adhesion layer is deposited on the layer of AlN before the negative photo resist is applied.

17. The method of claim 16 wherein the adhesion layer is selected from the group consisting of TiW, W, $SiO_2$ and $Si_3N_4$.

18. The method of claim 11 wherein the surface of the AlN matrix is bonded to the first substrate by bonding to a complementary bonding matrix on the first substrate.

19. The method of claim 11 wherein the AlN is covered by another film for bonding to the first substrate by bonding to a complementary bonding matrix on the first substrate.

20. The method of claim 19 wherein the other film is selected from the group consisting of Au, $SiO_2$ and Cu.

21. The method of claim 11 wherein the surface of the thick oxide is planarized using CMP.

22. A method of fabricating a MEMS device comprising:

providing a first substrate;

depositing a layer of AlN;

patterning the layer of AlN while creating a slope at the edges of the patterned layer using heated TMAH;

depositing a metallic top electrode;

patterning the top electrode to define a cantilevered member pattern extending up a slope at an edge of the patterned layer of AlN and extending over a part of the patterned layer of AlN; and, etching to remove the patterned layer of AlN and to leave a cantilevered member supported on an integral sloped support member.

23. The method of claim 22 further comprising forming an electrode under the patterned layer of AlN prior to depositing the layer of AlN.

24. The method of claim 22 wherein the layer of AlN is etched through a mask comprising a patterned layer of negative tone photo resist.

25. The method of claim 24 wherein an adhesion layer is deposited onto the AlN layer before the photo resist is applied.

26. The method of claim 22 wherein the layer of AlN is etched through a mask comprising a patterned layer of negative tone photo resist over a layer of TiW or W or $SiO_2$ or $Si_3N_4$ on the AlN.

27. The method of claim 22 wherein the etching to remove the patterned layer of AlN comprises etching with TMAH.

28. The method of claim 22 wherein a plurality of the MEMS devices are formed in a matrix on the first substrate, and further comprising:

providing a capping substrate, the first substrate having a matrix of BAW devices thereon and the capping substrate having a respective matrix of devices formed thereon;

providing a thick oxide over a surface of the capping substrate, including the devices on the capping substrate;

planarizing the surface of the thick oxide using CMP;

depositing a layer of AlN over the planarized surface of the thick oxide;

etching the AlN layer with heated TMAH through a mask to leave an AlN matrix with sloped bases, each cell of the AlN matrix surrounding one of the devices on the capping substrate;

bonding the surface AlN matrix to the first substrate so that each cell of the AlN matrix also surrounds a respective BAW devices on the first substrate to package the devices and to form cavities over the BAW devices on the first substrate; and, dicing the substrates to separate the packaged devices.

29. The method of claim 28 wherein at least some of the devices are integrated circuits.

30. The method of claim 28 wherein the AlN is etched through a mask comprising a negative tone photo-resist.

31. The method of claim 30 wherein an adhesion layer is deposited on the layer of AlN before the negative photo resist is applied.

32. The method of claim 31 wherein the adhesion layer is selected from the group consisting of TiW, W, $SiO_2$ and $Si_3N_4$.

33. The method of claim 28 wherein the surface of the AlN matrix is bonded to the first substrate by bonding to a complementary bonding matrix on the first substrate.

34. The method of claim 33 wherein the AlN is covered by another film for bonding to the first substrate by bonding to a complementary bonding matrix on the first substrate.

35. The method of claim 34 wherein the other film is selected from the group consisting of Au, $SiO_2$ and Cu.

36. A method of fabricating a MEMS device comprising:
providing a first substrate;
depositing a layer of AlN;
depositing an adhesion layer onto the AlN layer;
patterning the layer of AlN using a wet etch of heated TMAH through a mask of a patterned layer of negative tone photo resist while creating a slope at the edges of the patterned layer;
depositing a top electrode;
patterning the top electrode; and,
etching to remove the patterned layer of AlN.

37. A method of fabricating a MEMS device comprising:
providing a first substrate;
depositing a layer of AlN;
patterning the layer of AlN using a wet etch of heated TMAH through a mask of a patterned layer of negative tone photo resist over a layer selected from the group consisting of TiW, W, $SiO_2$ and $Si_3N_4$ on the AlN while creating a slope at the edges of the patterned layer;
depositing a top electrode;
patterning the top electrode; and,
etching to remove the patterned layer of AlN.

38. A method of fabricating a MEMS device comprising:
providing a first substrate;
depositing a layer of AlN;
depositing an adhesion layer onto the AlN layer;
patterning the layer of AlN by etching through a mask comprising a patterned layer of negative tone photo resist while creating a slope at the edges of the patterned layer using heated TMAH;
depositing a metallic top electrode;
patterning the top electrode; and,
etching to remove the patterned layer of AlN.

39. A method of fabricating a MEMS device comprising:
providing a first substrate;
depositing a layer of AlN;
patterning the layer of AlN by etching through a mask comprising a patterned layer of negative tone photo resist over a layer of TiW or W or $SiO_2$ or $Si_3N_4$ on the AlN while creating a slope at the edges of the patterned layer using heated TMAH;
depositing a metallic top electrode;
patterning the top electrode; and,
etching to remove the patterned layer of AlN.

* * * * *